United States Patent [19]
Low et al.

[11] Patent Number: 5,973,397
[45] Date of Patent: Oct. 26, 1999

[54] SEMICONDUCTOR DEVICE AND FABRICATION METHOD WHICH ADVANTAGEOUSLY COMBINE WIRE BONDING AND TAB TECHNIQUES TO INCREASE INTEGRATED CIRCUIT I/O PAD DENSITY

[75] Inventors: Qwai H. Low; Chok J. Chia, both of Cupertino; Seng-Sooi Lim, San Jose, all of Calif.

[73] Assignee: LSI Logic Corporation, Milpitas, Calif.

[21] Appl. No.: 08/955,929

[22] Filed: Oct. 22, 1997

[51] Int. Cl.$^6$ ..................................................... H01L 23/04
[52] U.S. Cl. ........................... 257/698; 257/700; 257/690
[58] Field of Search ...................................... 257/668, 666, 257/698, 778, 676, 700, 776, 773, 784, 692, 690

[56] References Cited

U.S. PATENT DOCUMENTS 5,212,405  5/1993  Oigawa et al. .

*Primary Examiner*—Sheila V. Clark

[57] ABSTRACT

A semiconductor device and fabrication method are presented which advantageously combine TAB and wire bonding techniques to increase integrated circuit I/O pad density. The semiconductor device includes an integrated circuit, a substrate, and a carrier film (i.e., a TAB tape). The integrated circuit has a set of input/output (I/O) pads arranged upon an upper surface. The substrate has a die cavity within an upper surface and a set of bond traces arranged about the die cavity. An underside surface of the integrated circuit is attached to the substrate within the die cavity. The carrier film is positioned over the upper surface of the substrate such that the upper surface of the integrated circuit is exposed through a die aperture and portions of the members of the set of bond traces are exposed through corresponding members of a set of bond trace apertures. Each conductor has a first end connected to a member of the set of bond traces and an opposed second end connected to a corresponding member of a portion of the set of I/O pads. Each of the remaining members of the I/O pads are connected to respective bond traces adjacent to the die cavity by bonding wires. By combining TAB and wire bonding techniques, the number of I/O pads per unit of upper surface area of the integrated circuit may be increased.

24 Claims, 2 Drawing Sheets

SEMICONDUCTOR DEVICE AND FABRICATION METHOD WHICH ADVANTAGEOUSLY COMBINE WIRE BONDING AND TAB TECHNIQUES TO INCREASE INTEGRATED CIRCUIT I/O PAD DENSITY

BACKGROUND OF THE INVENTION

1. Field of Invention

This invention relates to semiconductor device packages, and more particularly to bonding techniques used to connect integrated circuit input/output (I/O) pads to bond traces of semiconductor device packages.

2. Description of Related Art

During manufacture of an integrated circuit (e.g., a microprocessor), signal lines formed upon the silicon substrate and to be connected to external devices are terminated at flat metal contact regions called input/output (I/O) pads. Following manufacture, the integrated circuit is typically secured within a protective semiconductor device package. Each I/O pad of the chip is then connected to a bonding pad of the device package, and ultimately to a terminal which typically extends from the periphery of the package.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages.

Common methods used to connect the I/O pads of the integrated circuit to bond traces of the device package include wire bonding and tape automated bonding (TAB). In wire bonding, connections are made using fine metal wires (e.g., gold or aluminum wires). FIG. 1a is a partial perspective view of an integrated circuit 10 attached to an upper surface of a substrate 12 of a semiconductor device package. I/O pads 14 of integrated circuit 10 are arranged at or near the perimeter of integrated circuit 10, wherein I/O pads 14 are placed in close lateral proximity to bond traces 16 (often referred to as bonding "fingers"). Bonding wires 18 extend and make electrical connection between I/O pads 14 and bond traces 16. Bonding traces 16 are connected to terminals of the device package by electrically conductive signal traces.

TAB techniques connect I/O pads of the integrated circuit to bond traces of the device package using fine-line conductors etched from one or more sheets of metal (e.g., copper). The electrically conductive sheet is bonded to a sheet of a dielectric material (e.g., polyimide film), then portions of the conductive sheet are selectively removed in order to form the TAB conductors. The sheet of dielectric material maintains proper conductor spacing. FIG. 1b is a partial perspective view of integrated circuit 10 having I/O pads 14 bonded to etched metal "beam" conductors 20 of a flexible TAB "tape" 22. Conductors 20 are bonded to a sheet of dielectric material 23 and connected to terminals of the device package.

In wire bonding, each bonding wire is typically installed one after another in sequence. In TAB, on the other hand, multiple connections are made at the same time (i.e., in parallel). Thus wire bonding is a relatively slow process compared to TAB. In wire bonding, two or more bonding wires may inadvertently touch one another, causing an electrical short circuit and improper operation of the packaged semiconductor device. TAB tapes prevent conductors from coming into contact with one another. TAB tapes are, however, more expensive than bonding wire. However, the TAB tapes may also function as semiconductor device packages. Thus wire bonding and TAB techniques have benefits and drawbacks.

It would be advantageous to combine wire bonding and TAB techniques to form a hybrid bonding technique which includes the advantages of both methods. For example, the current states of wire bonding and TAB technologies place lower limits on the minimum distances between I/O pads of integrated circuits (i.e., I/O pad "pitch"). By combining the two technologies, however, it is possible to increase the number of I/O pads per unit of integrated circuit surface area (i.e., I/O pad density). Increasing I/O pad density not only helps solve the increasing I/O pad problem, but also allows the dimensions of semiconductor device packages employing the hybrid approach to be reduced. Such size reductions are advantageous, especially in portable applications.

SUMMARY OF THE INVENTION

The problems outlined above are in large part solved by a semiconductor device and fabrication method which advantageously combine TAB and wire bonding techniques to increase integrated circuit I/O pad density. The semiconductor device includes an integrated circuit, a substrate, and a carrier film (i.e., a TAB tape). The integrated circuit has opposed upper and underside surfaces, and has a set of input/output (I/O) pads arranged upon the upper surface. The substrate has opposed upper and underside surfaces, and includes a die cavity within the upper surface, a set of bond traces arranged about the die cavity, and a set of bonding pads arranged upon the underside surface. The die cavity receives the integrated circuit such that the upper surface of the integrated circuit is substantially even (i.e., flush) with the upper surface of the substrate. The underside surface of the integrated circuit is attached to the substrate within the die cavity. Members of the set of bonding pads function as device terminals, and are connected to corresponding members of the set of bond traces.

The carrier film includes a die aperture, a set of bond trace apertures, and a set of conductors bonded to the carrier film. The carrier film is positioned over the upper surface of the substrate such that the upper surface of the integrated circuit is exposed through the die aperture and members of the set of bond traces are exposed through corresponding members of the set of bond trace apertures. Each conductor has a first end connected to a member of the set of bond traces and an opposed second end connected to a corresponding member of the set of I/O pads. A portion of the set of bond traces located adjacent to the die cavity have bonding fingers extending therefrom. Bonding wires connect the bonding fingers to corresponding members of the set of I/O pads. By combining TAB and wire bonding techniques, the number of I/O pads per unit of upper surface area of the integrated circuit may be increased.

The method of fabricating the semiconductor device includes providing the above substrate, integrated circuit, and carrier tape. The underside surface of the integrated circuit is attached to the substrate within the die cavity. The carrier film is then positioned over the upper surface of the substrate as described above. The first end of each conductor is connected to a corresponding member of the set of bond traces exposed through the associated bond trace aperture. The second end of each conductor is connected to a member of the set of I/O pads. The bonding fingers of the bond traces nearest the die cavity are also exposed through associated bond trace apertures. A bonding wire is connected between each bonding finger and a corresponding member of the set of I/O pads.

BRIEF DESCRIPTION OF THE DRAWINGS

Other objects and advantages of the invention will become apparent upon reading the following detailed description and upon reference to the accompanying drawings in which:

FIG. 2b is a side elevation view of the semiconductor device of FIG. 2a.

Figure 1A:
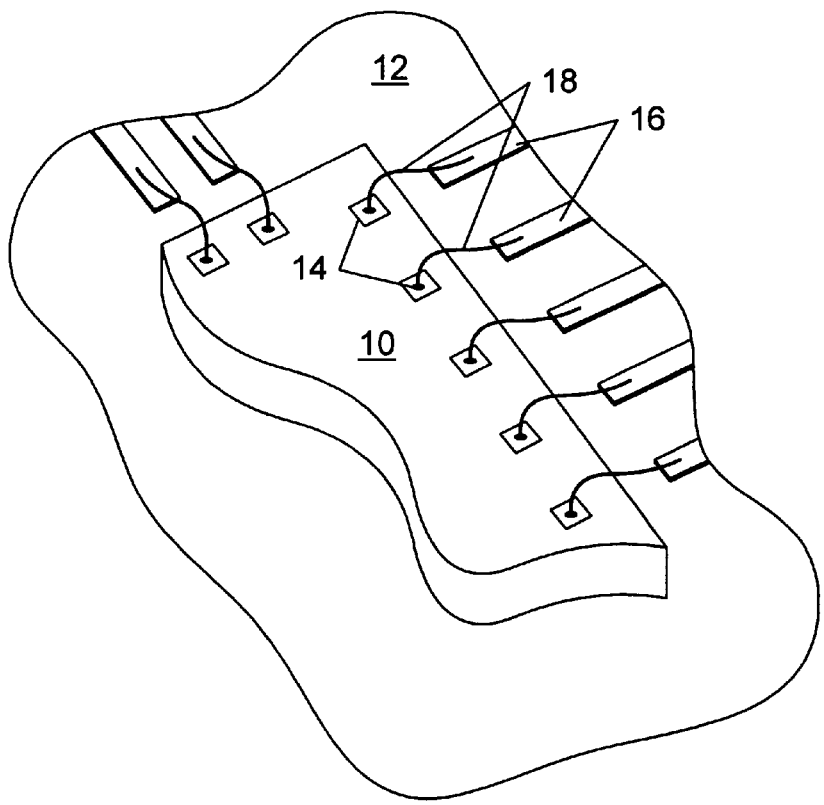
FIG. 1a is a partial perspective view of an integrated circuit attached to an upper surface of a substrate of a semiconductor device package and illustrating a typical wire bonding process, wherein I/O pads of the integrated circuit are connected to bonding fingers of the substrate by bonding wires, and wherein the bonding fingers are connected to terminals of the device package by electrically conductive signal traces.
Figure 1B:
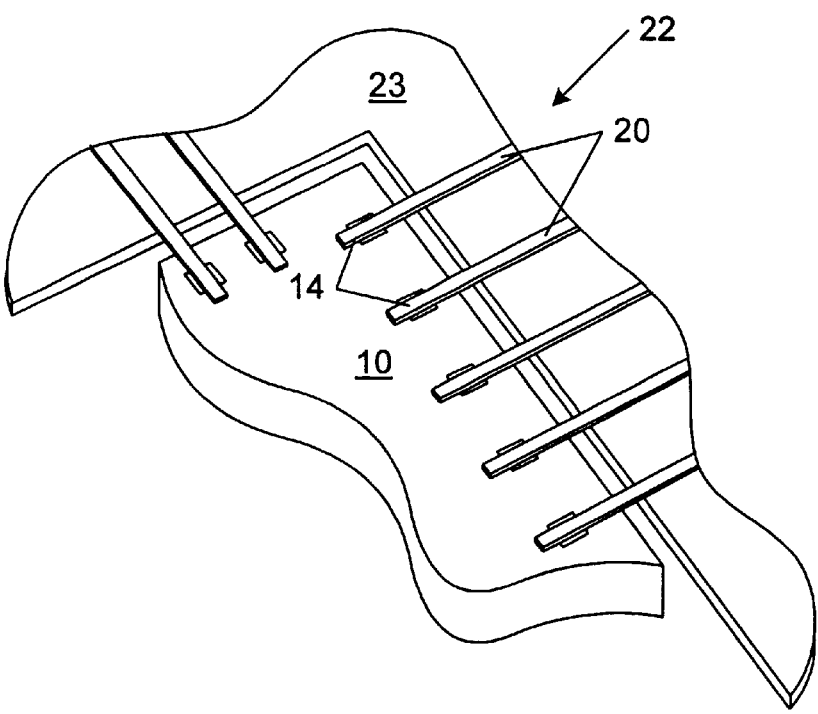
FIG. 1b is a partial perspective view of an integrated circuit having I/O pads bonded to etched metal conductors in accordance with a TAB technique, wherein the conductors are bonded to a flexible TAB tape which helps maintain proper conductor spacing.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2A:
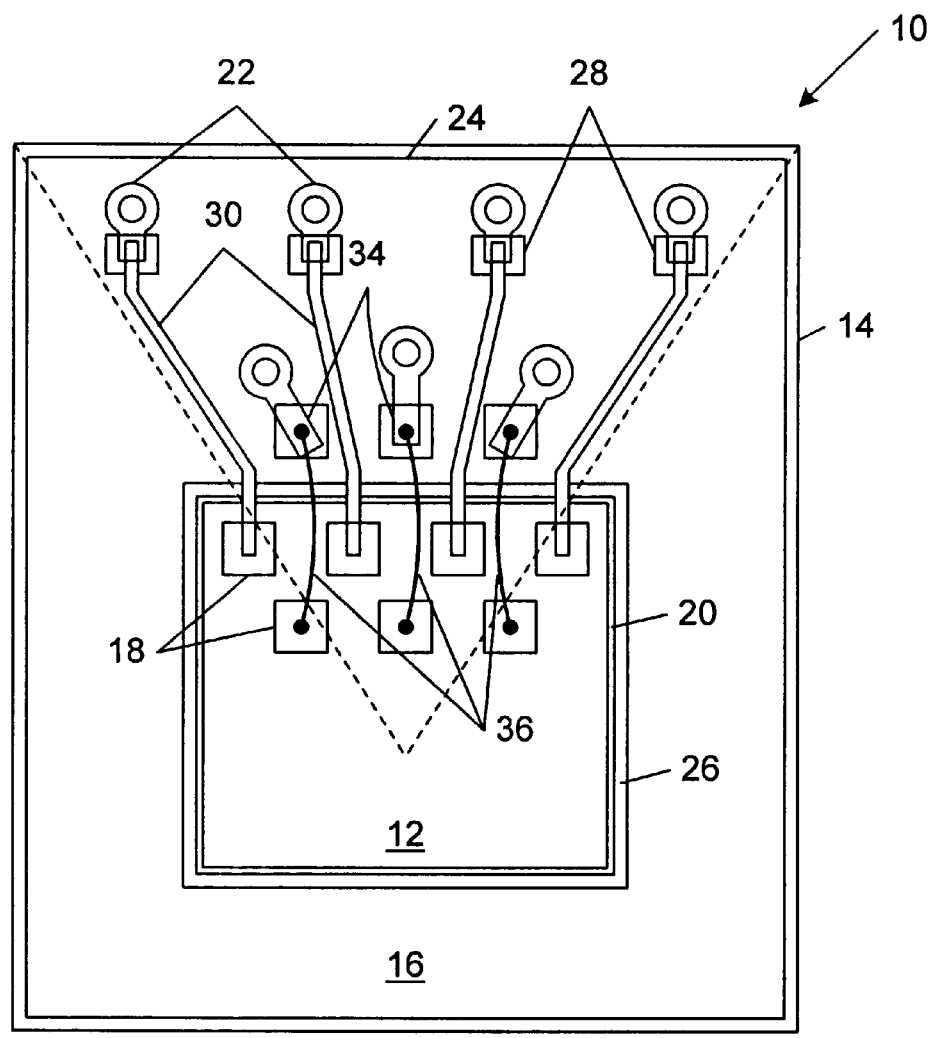
FIG. 2a is a top plan view of one embodiment of a semiconductor device in accordance with the present invention, wherein the semiconductor device includes an integrated circuit, a substrate, and a carrier film, and wherein the integrated circuit includes multiple I/O pads arranged upon an upper surface, and wherein the substrate includes a set of bond traces arranged upon an upper surface, and wherein the carrier film includes conductive traces (i.e., conductors) bonded to a sheet of dielectric material, and wherein each of the set of conductors has a first end connected to a member of the set of bond traces and an opposed second end connected to a corresponding member of the set of I/O pads, and wherein each of a portion of the set of bond traces adjacent to the integrated circuit is connected to a corresponding member of the set of I/O pads by a bonding wire.

FIG. 2a is a top plan view of one embodiment of a semiconductor device 10 in accordance with the present invention. Semiconductor device 10 includes a monolithic integrated circuit (i.e., chip) 12, a substrate 14, and a carrier film 16. Carrier film 16 is preferably a tape automated bonding (TAB) tape. Chip 12 includes one or more electronic devices formed upon a monolithic semiconductor substrate. An underside surface of chip 12 is attached to substrate 14 within a recessed die cavity 20. Die cavity 20 is located substantially in the center of an upper surface of substrate 14. Chip 12 also includes multiple I/O pads 18 arranged about the periphery of an upper surface. Substrate 14 includes a set of bond traces 22 on an upper surface and a set of bonding pads on the underside surface. Members of the set of bond traces 22 and the set of bonding pads are preferably arranged in two-dimensional arrays. Members of the set of bonding pads function as device package terminals, and are connected to corresponding members of the set of bond traces 22. Substrate 14 may be substantially made of, for example, fiberglass-epoxy composite printed circuit board material or a ceramic material (e.g., aluminum oxide, alumina, $Al_2O_3$, or aluminum nitride, AlN).

Carrier film 16 includes multiple electrically conductive traces 30 patterned from a sheet of conductive material (e.g., copper) bonded to a sheet of a dielectric material 24 (e.g., polyimide). Carrier film 16 may be fabricated by forming the sheet of a dielectric material 24 upon the sheet of conductive material, then patterning the sheet of conductive material to form conductive traces 30. Well known photolithographic techniques may be used to pattern the sheet of conductive material. Alternately, carrier film 16 may be fabricated by forming a layer of the conductive material upon the sheet of dielectric material 24, then patterning the conductive material layer. The sheet of dielectric material 24 maintains proper spacing of conductive traces 30 during handling and installation of carrier film 16. Carrier film 16 also includes a relatively large die aperture 26 through which the upper surface of chip 12 is exposed, and several smaller bond trace apertures 28 through which portions of the members of the set of bond traces 22 are exposed. Such apertures may be formed by selectively removing portions of the sheet of dielectric material 24 (e.g., by etching) following the patterning of the sheet of conductive material.

Following attachment of chip 12 to substrate 14, carrier film 16 is positioned over the upper surface of substrate 14 as shown in FIG. 2a such that the sheet of dielectric material 24 is interposed between the upper surface of substrate 14 and conductive traces 30. Each conductive trace 30 has two ends. One end extends into die aperture 26 and over an associated I/O pad 18, and the other end extends into a bond trace aperture 28 and over a portion of an associated bond trace 22. Once electrically connected to the associated I/O pad 18 and bond trace 22, each conductive trace 30 forms an electrically conductive signal path between the I/O pad 18 and the bond trace 22. It is noted that the end of each conductor 30 extending into a bond trace aperture 28 and over a portion of an associated bond trace 22 is preferably wider than the end extending into die aperture 26 and over an associated I/O pad 18.

Members of a portion of the set of bond traces 22 adjacent to die cavity 20 and chip 12 have bonding fingers 34 extending therefrom. Bonding fingers 34 are exposed through corresponding bond trace apertures 28. During fabrication of semiconductor device 10, a bonding wire 36 is installed between each bonding finger 34 and an associated I/O pad 18. Once the bonding wire 36 is installed, an electrically conductive signal path is formed between the I/O pad 18 and the corresponding bond trace 22.

In accordance with well know TAB techniques, the surfaces of the I/O pads and members of the set of bond traces are preferably raised above surrounding surfaces. This may be accomplished by adding conductive material to the surfaces of the pads, or by removing material from the surrounding surfaces. Alternately, conductive material may be added to the ends of the conductive traces of carrier tape 16 (e.g., by electrodeposition) in order to prevent the sheet of dielectric material 24 from contacting the surrounding surfaces during and after the making of the TAB-type connections. Multiple connections are preferably made simultaneously by applying heat and/or pressure to the connection sites.

In the embodiment of FIG. 2a, two rows of I/O pads 18 are arranged about the periphery of the upper surface of chip 12. Each I/O pad 18 within the row nearest the periphery (i.e., an outer row) receives a member of the set of conductive traces 30. Each I/O pad 18 within the row farthest from the periphery (i.e., an inner row) is spaced between the I/O pads 18 of the outer row, and is connected to a bond finger of a bond trace 22 located adjacent to the periphery of chip 12 via a bonding wire 36. This arrangement is advantageous in that the distance between members of the outer row of I/O pads 18 may be reduced as much as current TAB technology will allow.

Figure 2B:
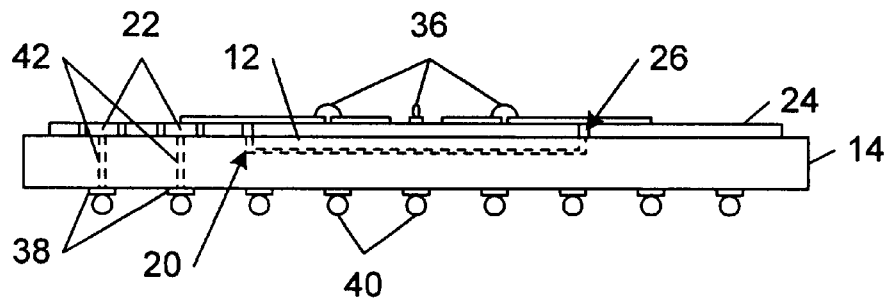

FIG. 2b is a side elevation view of semiconductor device 10. As described above, members of the set of bonding pads arranged upon the underside surface, labeled 38, function as device package terminals. In FIG. 2b, members of the set of bonding pads 38 are coated with solder, forming solder balls 40 which may be attached to corresponding signal traces of a printed circuit board (PCB). Alternately, members of the set of bonding pads 38 may have pins for connecting to a PCB or for inserting into a socket. It is noted that die cavity 20 is preferably dimensioned such that the upper surface of chip 12 is substantially even with the upper surface of substrate 14 to aid in the installation of carrier film 16.

In the embodiment of FIG. 2b, members of the set of bond traces 22 are located directly above corresponding members of the set of bonding pads 38. Members of the set of bond traces 22 are connected to corresponding members of the set of bonding pads 38 by vertical conductors (i.e., vias) 42 within substrate 14. Alternately, substrate 14 may include one or more planar layers of signal traces, and members of the set of bond traces 22 may be connected to corresponding members of the set of bonding pads 38 by signal traces connected by vias.

Numerous variations and modifications will become apparent to those skilled in the art once the above disclosure is fully appreciated. It is intended that the following claims be interpreted to embrace all such variations and modifications.

What is claimed is:

1. A package, comprising:
 a substrate having opposed first and second surfaces;
 a plurality of bond traces arranged upon the first surface and connected to a plurality of terminals extending from the second surface;
 a dielectric film for covering at least a portion of the first surface and having a relatively large opening extending through the film surrounded by a plurality of relatively small apertures also extending through the film, wherein said apertures are aligned over said bond traces when said film is formed upon said substrate; and
 a set of conductors bonded to the film and having opposing first and second ends, wherein the first end of each conductor extends into a respective one of said apertures, and wherein the second end of each conductor extends laterally across said film into said opening.

2. The package as recited in claim 1, wherein said dielectric film electrically isolates said set of conductors from said substrate except for said set of bond traces.

3. The package as recited in claim 1, further comprising an integrated circuit fixedly secured to said substrate and extending through said opening.

4. The package as recited in claim 3, wherein said integrated circuit comprises a plurality of pads adapted to directly receive the second end of said set of conductors.

5. The package as recited in claim 3, wherein said integrated circuit comprises a plurality of pads, each of which is adapted to receive a bonding wire coupled from a respective bond trace.

6. A semiconductor device, comprising:
 a substrate having a die cavity within an upper surface and comprising a set of bond traces, wherein the die cavity is dimensioned to receive an integrated circuit, and wherein members of the set of bond traces are arranged upon the upper surface about the die cavity;
 an integrated circuit having opposed upper and underside surfaces and comprising a set of input/output (I/O) pads arranged upon the upper surface, wherein the integrated circuit is positioned within the die cavity, and wherein the underside surface is attached to the substrate; and
 a carrier film comprising a die aperture, a set of bond trace apertures, and a set of conductors bonded to the carrier film, wherein the carrier film is positioned over the upper surface of the substrate such that the upper surface of the integrated circuit is exposed through the die aperture and members of the set of bond traces are exposed through corresponding members of the set of bond trace apertures, and wherein each of the set of conductors has a first end connected to a member of the set of bond traces and an opposed second end connected to a corresponding member of a portion of the set of I/O pads, and wherein members of the remainder of the set of I/O pads are connected to respective members of the set of bond traces adjacent to the die cavity by bonding wires.

7. The semiconductor device as recited in claim 6, wherein the integrated circuit comprises at least one electronic device formed upon a monolithic semiconductor substrate.

8. The semiconductor device as recited in claim 6, wherein the substrate comprises a fiberglass-epoxy composite material.

9. The semiconductor device as recited in claim 6, wherein the substrate comprises a ceramic material.

10. The semiconductor device as recited in claim 6, wherein the die cavity is dimensioned such that the upper surface of the integrated circuit is substantially even with the upper surface of the substrate.

11. The semiconductor device as recited in claim 6, wherein the carrier film is fabricated by forming a layer of a dielectric material upon a sheet of a conductive material, then patterning the sheet of conductive material to form the set of conductors.

12. The semiconductor device as recited in claim 11, wherein the dielectric material is polyimide.

13. The semiconductor device as recited in claim 11, wherein the conductive material is copper.

14. The semiconductor device as recited in claim 6, wherein the carrier film is fabricated by depositing a layer of a conductive material upon a sheet of a dielectric material, then patterning the layer of conductive material to form the set of conductors.

15. A semiconductor device, comprising:
 a substrate having opposed upper and underside surfaces, wherein the substrate comprises:
  a die cavity within the upper surface and dimensioned to receive an integrated circuit;
  a set of bond traces arranged about the die cavity; and
  a set of bonding pads arranged upon the underside surface, wherein members of the set of bonding pads are connected to corresponding members of the set of bond traces;

an integrated circuit having opposed upper and underside surfaces and comprising a set of input/output (I/O) pads arranged upon the upper surface, wherein the integrated circuit is positioned within the die cavity, and wherein the underside surface is attached to the substrate; and a carrier film comprising a die aperture, a set of bond trace apertures, and a set of conductors bonded to the carrier film, wherein the carrier film is positioned over the upper surface of the substrate such that the upper surface of the integrated circuit is exposed through the die aperture and members of the set of bond traces are exposed through corresponding members of the set of bond trace apertures, and wherein each of the set of conductors has a first end connected to a member of the set of bond traces and an opposed second end connected to a corresponding member of a portion of the set of I/O pads, and wherein members of the remainder of the set of I/O pads are connected to respective members of the set of bond traces adjacent to the die cavity by bonding wires.

16. The semiconductor device as recited in claim 15, wherein the integrated circuit comprises at least one electronic device formed upon a monolithic semiconductor substrate.

17. The semiconductor device as recited in claim 15, wherein the substrate comprises a fiberglass-epoxy composite material.

18. The semiconductor device as recited in claim 15, wherein the substrate comprises a ceramic material.

19. The semiconductor device as recited in claim 15, wherein the die cavity is dimensioned such that the upper surface of the integrated circuit is substantially even with the upper surface of the substrate.

20. A method of fabricating a semiconductor device, comprising:

providing a substrate having opposed upper and underside surfaces, wherein the substrate comprises:
 a die cavity within the upper surface and dimensioned to receive an integrated circuit;
 a set of bond traces arranged about the die cavity; and
 a set of bonding pads arranged upon the underside surface, wherein members of the set of bonding pads are connected to corresponding members of the set of bond traces;

providing an integrated circuit having opposed upper and underside surfaces and comprising a set of input/output (I/O) pads arranged upon the upper surface;

providing a carrier film comprising a die aperture, a set of bond trace apertures, and a set of conductors bonded to the carrier film, wherein each conductor has a first end extending into a bond trace aperture and an opposed second end extending into the die aperture;

attaching the underside surface of the integrated circuit to the substrate within the die cavity;

positioning the carrier film over the upper surface of the substrate such that the upper surface of the integrated circuit is exposed through the die aperture and members of the set of bond traces are exposed through corresponding members of the set of bond trace apertures;

connecting the first end of each conductor to a member of the set of bond traces exposed through the associated bond trace aperture;

connecting the second end of each conductor to a member of a portion of the set of I/O pads; and connecting a bonding wire between members of the remainder of the set of I/O pads and respective members of the set of bond traces adjacent to the die cavity.

21. The method as recited in claim 20, wherein the integrated circuit comprises at least one electronic device formed upon a monolithic semiconductor substrate.

22. The method as recited in claim 20, wherein the substrate comprises a fiberglass-epoxy composite material.

23. The method as recited in claim 20, wherein the substrate comprises a ceramic material.

24. The method as recited in claim 20, wherein the die cavity is dimensioned such that the upper surface of the integrated circuit is substantially even with the upper surface of the substrate.

* * * * *